United States Patent [19]

Fukuda

[11] Patent Number: 4,535,694
[45] Date of Patent: Aug. 20, 1985

[54] LOOPED, ELONGATE LETTERPIECES PRINTING PLATE FOR USE ON ROTARY PRESSES, AND METHOD OF PREPARATION

[76] Inventor: Manabu Fukuda, 122, Takano-1 Chome, Misato-Shi, Saitama-Ken, Japan

[21] Appl. No.: 482,952

[22] Filed: Apr. 7, 1983

[30] Foreign Application Priority Data

Apr. 8, 1982 [JP] Japan ................ 57-57281

[51] Int. Cl.³ .......................... G03F 7/02; B41N 1/16
[52] U.S. Cl. ........................... 101/395; 101/111
[58] Field of Search ............ 101/415.1, 395, DIG. 27, 101/111, 105; 400/228

[56] References Cited

U.S. PATENT DOCUMENTS

| 2,760,853 | 8/1956 | Plambeck, Jr. | 101/395 |
| 3,090,299 | 5/1963 | Comstock | 400/228 |
| 3,858,510 | 1/1975 | Kai et al. | 101/395 |
| 4,046,071 | 9/1977 | Mizuno et al. | 101/395 |
| 4,289,071 | 9/1981 | Hallman et al. | 101/395 |

FOREIGN PATENT DOCUMENTS

| 968221 | 5/1975 | Canada | 101/DIG. 27 |
| 144157 | 11/1981 | Japan | 101/DIG. 27 |

OTHER PUBLICATIONS

Bonner et al., Sprocket-Driven Print Belt, Apr. 1978, IBM Tech. Disclosure Bulletin, vol. 20, No. 11B, p. 4750.

Primary Examiner—Edgar S. Burr
Assistant Examiner—M. J. Hirabayashi
Attorney, Agent, or Firm—Robert E. Burns; Emmanuel J. Lobato; Bruce L. Adams

[57] ABSTRACT

A letterpress printing plate in the form of an elongate, looped flexible band having a base layer, as of polyester, and a photosensitive layer. The photosensitive layer is exposed to ultraviolet light through a negative, and its unhardened portions are dissolved away, thereby leaving a printing image and one or two series of markings in relief on the base layer. Typically in the form of annular banks, the markings are arranged at constant spacings along one or, preferably, both sides of the base layer. Perforations are then formed in the base layer through the annular banks thereon. In its use on a web-fed rotary press the looped, perforated printing plate is to be wrapped around a plate cylinder and a guide cylinder spaced therefrom, with its perforations engaged with sprocket teeth on the plate cylinder, for printing the long image on a web against an impression cylinder.

16 Claims, 6 Drawing Figures

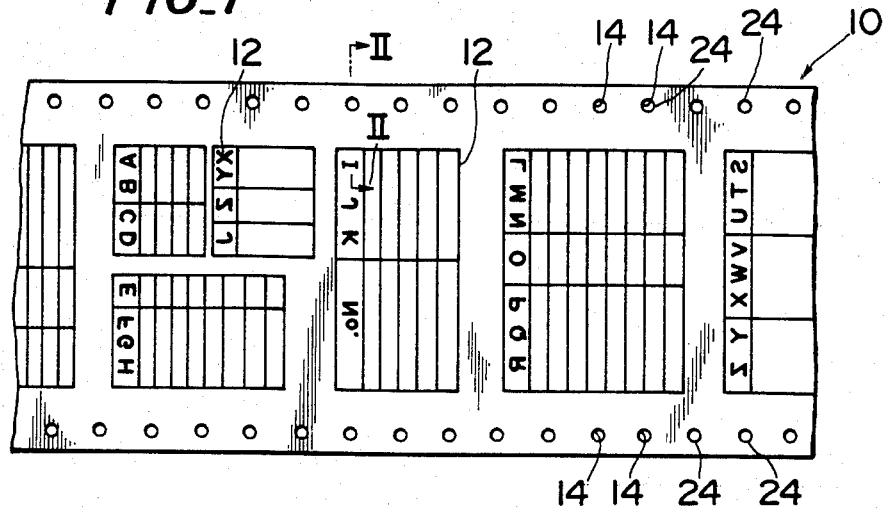
FIG_1
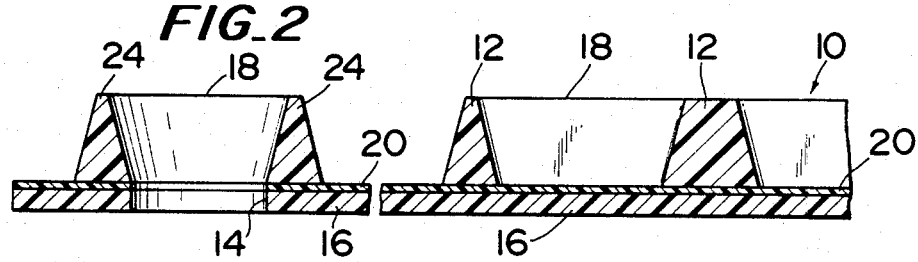
FIG_2
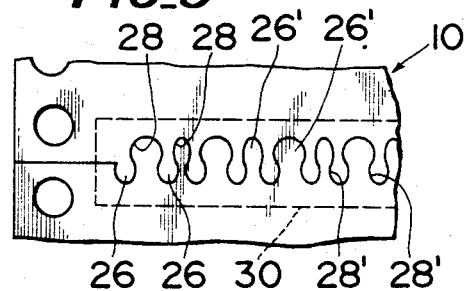
FIG_3

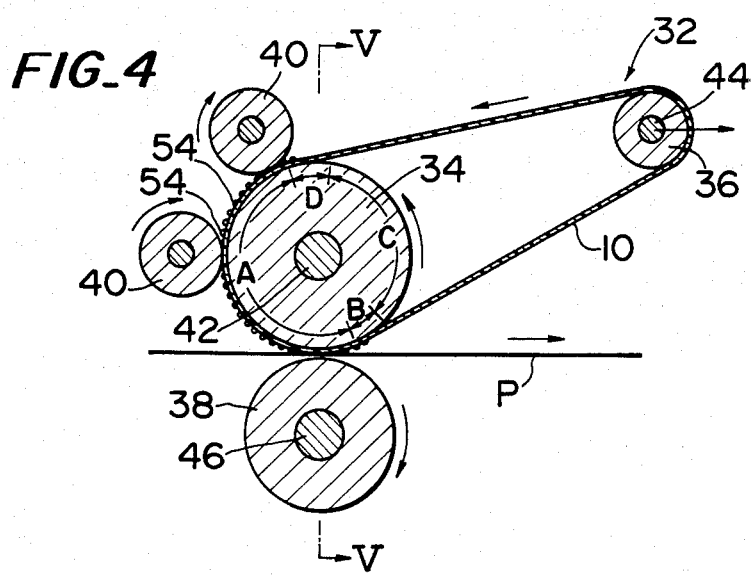
FIG_4
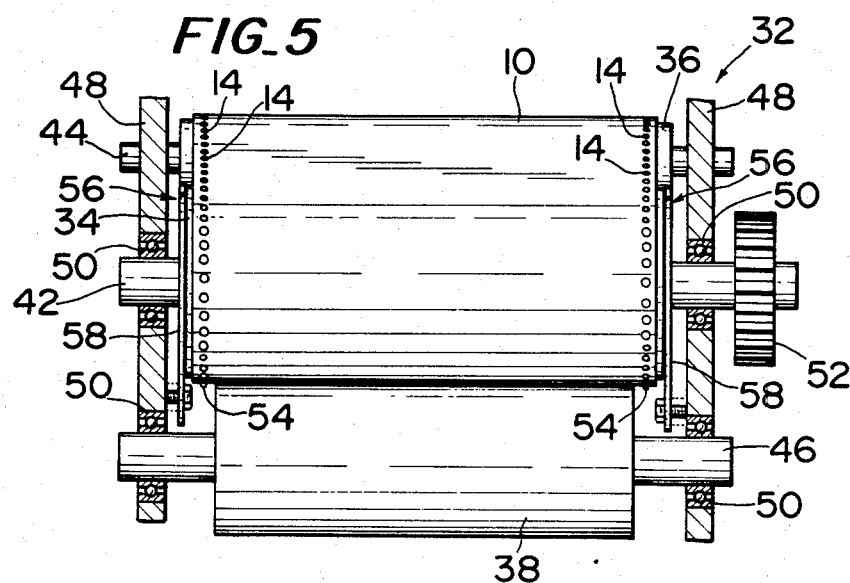
FIG_5
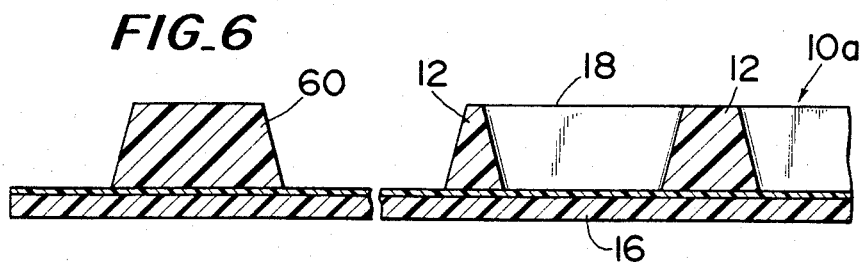
FIG_6

LOOPED, ELONGATE LETTERPIECES PRINTING PLATE FOR USE ON ROTARY PRESSES, AND METHOD OF PREPARATION

BACKGROUND OF THE INVENTION

My invention concerns a printing plate of very extended longitudinal dimension (e.g., of the order of meters) capable of printing correspondingly long images on a continuous web of paper or the like with a single impression. More specifically my invention pertains to such a printing plate of the letterpress or relief variety for use on a rotary press of the kind disclosed herein. It is also specifically directed to a method of preparing such an elongate letterpress printing plate.

As is well known, in a rotary press, the printing plate is wrapped around a plate cylinder and prints on the paper against an impression cylinder. Thus the circumferential dimension of the plate cylinder determines the length of the plate, or of the image to be printed at one time. For very long productions, therefore, such as continuous accounting forms for the imprinting of computer outputs, several printing plates have had to be prepared and used one after another on one and the same web of paper. This conventional practice incurs, of course, a substantial waste of time and much printing cost.

I am aware of one known solution to the problem, calling for the use of an endless belt of rubber or the like to be wrapped around the plate cylinder and a guide cylinder spaced therefrom. A plastic letterpress printing plate is bonded to the rubber belt, which thus serves as the backing for the plate. In this case the total length of the rubber backing, not the circumference of the plate cylinder, determines the unit length of productions, so that any long image can be reproduced with a single impression.

This prior art solution has a serious drawback, however. The contiguous plastic printing plate and rubber backing are subjected to shear as they are repeatedly curved over the plate and guide cylinders and flattened along the paths therebetween. Consequently the printing plate easily comes off the backing, which is very thick in comparison with the plate, thus making impossible the accurate reproduction of the original. The known printing method has therefore failed to wind widespread commercial acceptance.

SUMMARY OF THE INVENTION

My invention overcomes the noted problem of the prior art and provides an improved letterpress printing plate, and a method of its preparation, capable of accurately printing at one time a very long image on a web of paper or on any other surface capable of receiving the ink therefrom.

Stated broadly, the improved letterpress printing plate of my invention takes the form of an elongate, looped flexible band comprising a base layer and a photosensitive layer integrally attached to each other. The photosensitive layer is photoetched to leave in relief a printing image and at least one series of markings on the base layer, with the markings arranged longitudinally of the base layer on a marginal edge portion thereof. Further the printing plate has a series of perforations formed therethrough, in positions indicated by the relief markings on the base layer.

For the preparation of the relief printing plate by the method of my invention, there is first provided an elongate flexible band having the base layer and the photosensitive layer firmly attached to each other, as by use of an adhesive. The photosensitive layer is exposed to light through a negative to cause selective hardening thereof, and the unhardened portions of the photosensitive layer are subsequently dissolved away. Thus the printing image and the markings are both left in relief on the base layer. Then the perforations are formed through the base layer in the positions of the relief markings. The printing plate is completed as the opposite ends of the band are then joined together.

The improved letterpress printing plate of my invention, constructed and prepared as in the foregoing, is intended for use with a rotary press of the type comprising a plate cylinder having sprocket teeth formed thereon, and a guide cylinder spaced therefrom. Looped around the plate cylinder and the guide cylinder, the printing plate receives the sprocket teeth on the plate cylinder in its perforations.

It is particularly noteworthy that the perforations in the printing plate can be formed in exact positions relative to the printing image thereon because such positions are suggested by the relief markings created on the base layer simultaneously with the relief printing image thereon by the photoetching method. Moreover, since the base layer can be much thinner than the photosensitive layer, the printing image can be reproduced on a desired surface with high fidelity, no matter how long the printing plate may be. The mounting of the printing plate on the press is also very easy compared with the conventional practice of bonding a plate to the endless rubber backing in position thereon.

I have actually fabricated letterpress printing plates of the above character having lengths of up to about seven meters. The use of these printing plates yielded highly favorable results. If equipment allowed, printing plates with a length of 100 meters or even more would be prepared and put to use with no less satisfactory results.

The above and other features and advantages of my invention and the manner of attaining them will become more apparent, and the invention itself will best be understood, from a study of the following detailed description and appended claims taken together with the attached drawings.

BRIEF DESCRIPTION OF THE DRAWINGS

FIG. 1 is a fragmentary representation of an example of letterpress printing plate embodying the novel concepts of my invention;

FIG. 2 is an enlarged, fragmentary section, partly broken away for illustrative convenience, of the printing plate, taken along the line II—II of FIG. 1;

FIG. 3 is a fragmentary representation of the printing plate, showing the way in which its opposite ends are joined to form the plate into a loop;

FIG. 4 is a diagrammatic vertical section through a web-fed rotary press having the printing plate of my invention mounted thereon for printing operation;

FIG. 5 is an enlarged section, with parts shown in elevation, through the rotary press taken along the line V—V of FIG. 4; and FIG. 6 is a view similar to FIG. 2 but showing a modified form of the letterpress printing plate.

DETAILED DESCRIPTION

I have shown in FIG. 1 a typical form of the letterpress printing plate in accordance with my invention. Generally designated 10, the printing plate is an elongate, looped band of plastics material having any desired printing image 12 formed in relief on one face thereof. A series of perforations or sprocket holes 14 are formed at constant longitudinal spacings in opposite lateral marginal edge portions of the printing plate 10.

Attention is now called to the sectional details of the printing plate 10 drawn on an enlarged scale in FIG. 2, in order to discuss the inventive method of its fabrication. The fabrication of the printing plate 10 starts with the preparation of an elongate band comprising a base layer 16 of polyester or the like and a photosensitive layer 18. The base 16 and photosensitive layer 18 are bonded to each other via a coating 20 of a high-strength synthetic adhesive to which there has been added a halation-preventing agent. Typically the base layer 16 is 0.20 millimeter in thickness, the photosensitive layer 18 is 1.00 millimeter, and the adhesive coating 20 is 0.04 millimeter.

Then a negative, not shown, of the desired printing image and markings to indicate the positions where the perforations 14 are to be formed is superimposed on the photosensitive layer 18. Then this layer is exposed to ultraviolet light through the negative. During exposure the photosensitive layer 18 hardens. The plastics band is then placed in alcohol or water to dissolve the unhardened portions of the photosensitive layer 18 away from over the base layer 16, or from over the adhesive coating 20.

Thus photoetched, the photosensitive layer 18 remains in the form of the printing image 12 and series of markings 24 standing in relief on the base layer 16, or on the adhesive coating 20 thereon. Preferably, and as shown, the markings 24 are each in the shape of an annular projection, having an inside diameter approximately equal to the diameter of each perforation 14 to be created. In this particular embodiment the annular projections are of course formed at constant spacings in the opposite marginal edge portions of the printing plate.

Next comes the step of punching the series of perforations 14 in the base layer 16 and the adhesive coating 20 thereon. The perforations are punched through the respective annular projections in alignment therewith with the projections serving as the markings 24. It is possible in this manner to exactly position the perforations or sprocket holes 14 in relation to the printing image 12.

The printing plate 10 is completed as it is subsequently looped by joining its opposite ends. FIG. 3 depicts one possible method of interconnecting the ends of the printing plate 10. The printing plate, or its base layer 16, has a plurality or multiplicity of approximately circular tongues 26 and approximately circular recesses 28 formed alternately at one end, and approximately circular tongues 26' and approximately circular recesses 28' formed alternately at the other end. The tongues 26 and recesses 28 at one end of the printing plate are staggered with respect to the tongues 26' and recesses 28' at the other end. The ends of the printing plate are joined by closely engaging the tongues 26 and 26' in the recesses 28' and 28, respectively. An adhesive tape 30 is attached to the interfitting ends of the plate, from at least either side thereof, to prevent disengagement. The joint thus formed is strong enough and substantially equal in thickness to the rest of the printing plate, presenting no impediment whatever to the printing operation.

FIGS. 4 and 5 are diagrammatic representations of a web-fed rotary press, generally referenced 32, suitable for use with the looped letterpress printing plate 10 of my invention. The rotary press 32 comprises a plate cylinder 34, a guide cylinder 36 in parallel spaced relation to the plate cylinder, an impression cylinder 38 tangent to the plate cylinder, and one or more, two in the illustrated machine, inking rolls 40 also tangent to the plate cylinder.

As seen in FIG. 5, all the cylinders 34, 36 and 38 are mounted on respective shafts 42, 44 and 46 which are rotatably supported between a pair of opposed walls 48 via bearings such as those indicated at 50. The shaft 42 carrying the plate cylinder 34 projects outwardly of one of the supporting walls 48 and has a gear 52 fixedly mounted thereon. This gear is coupled to any suitable drive mechanism, not shown, for imparting rotation to the plate cylinder 34 in the direction of the arrow in FIG. 4.

The printing plate 10 of my invention is to be wrapped around the plate cylinder 34 and the guide cylinder 36, as shown in FIG. 4. It is understood that the guide cylinder 36 is biased away from the plate cylinder 32, as by spring or weight means, not shown, to hold the printing plate 10 under tension. The spacing between plate cylinder and guide cylinder should preferably be made adjustable over a wide range to accommodate the press to the interchangeable use of printing plates of greatly varying lengths.

It will be observed from FIG. 5 that the plate cylinder 34 is of greater axial dimension than the impression cylinder 38, with the opposite end portions of the plate cylinder projecting beyond the impression cylinder. The plate cylinder 34 has two rows of sprocket teeth 54 mounted at constant circumferential spacings on its projecting end portions, in order that the sprocket teeth may not interfere with the impression cylinder 38. The two inking rolls 40 are understood to be of approximately the same length as the impression cylinder 38, so that the sprocket teeth 54 on the plate cylinder do not interfere with the inking rolls, either.

Intended to engage in the perforations or sprocket holes 14 in the printing plate 10, the sprockets or sprocket teeth 54 may be fixed to, or integral with, the plate cylinder 34. In such case, however, the sprocket teeth might fail to smoothly pull out of the perforations in the printing plate as the latter travels away from the plate cylinder, particularly during high speed rotation thereof. This possibility can be precluded by making the sprocket teeth selectively retractable into the plate cylinder depending upon their angular positions on the cylinder, as discussed in further detail hereafter.

In FIG. 4 the letter A denotes the angular region on the plate cylinder 34 where it makes contact with the printing plate 10. In this region the sprockets or sprocket teeth 54 must be held projecting from the plate cylinder 34 to engage in the perforations or sprocket holes 14 in the printing plate 10. During the subsequent short region B, where the printing plate moves out of contact with the plate cylinder, the sprocket teeth should retract into the plate cylinder out of the printing plate perforations. The sprocket teeth can remain retracted throughout the next region C where the printing plate is out of contact with the plate cylinder. During the final short region D the sprocket teeth must come out of the plate cylinder to reengage in the perforations in the printing plate as the latter travels back into contact with the plate cylinder at the starting point of the initial region A. Should the sprocket teeth be held projecting from the plate cylinder in the region B, they might not properly disengage the printing plate during the high speed rotation of the plate cylinder.

For such projection and retraction of the sprocket teeth 54 in timed relation to the revolution of the plate cylinder 34, there can be employed a pair of cam mechanisms generally designated 56 in FIG. 5. Each cam mechanism 56 includes a holder plate 58 fixedly mounted to one of the walls 48 of the press. The holder plate 58 carries a cylindrical or disclike cam, not seen, concentrically disposed in a hollow at each end of the plate cylinder 34. The unshown cam has a contoured, undercut annular groove in its periphery in which there are slidably engaged the flanged inner ends of the sprocket teeth 54. Thus, with the rotation of the plate cylinder 34 relative to the fixed pair of cams, the two rows of sprocket teeth 54 jointly move out of and back into the plate cylinder in the manner described in conjunction with FIG. 4.

In the operation of the rotary press 32, the web of paper P passes between plate cylinder 34 and impression cylinder 38 and travels to the right, as viewed in FIG. 4, with the rotation of the plate cylinder in a counterclockwise direction. The two successive inking rolls 40 apply ink to the relief printing image 12 on the printing plate 10. The plate cylinder 34 impresses the inked printing image on the paper P against the impression cylinder 38.

During such printing operation the two rows of sprocket teeth 54 project from the plate cylinder 34 throughout its circumferential region A, where the plate cylinder contacts the printing plate 10, to engage in the respective rows of perforations 14 in the printing plate. Accordingly there is practically no possibility of the printing plate slipping over the plate cylinder.

FIG. 6 shows a possible modification of the letterpress printing plate 10 of FIGS. 1 and 2. Generally referenced 10a, the modified printing plate features a series of sprocket teeth 60 formed by the photoetching of the photosensitive layer 18 on each marginal edge portion of the base layer 16 in lieu of the annular projections 24 of FIG. 2. The relief printing image 12 is of course created simultaneously with the sprocket teeth 60.

In a rotary press for use with the modified letterpress printing plate 10a, the plate cylinder need not be equipped with sprocket teeth; instead, two rows of holes are formed at circumferential spacings on the impression cylinder in the vicinities of its opposite ends. The plate and impression cylinders can be of approximately the same axial length. The sprocket teeth 60 on the printing plate 10a are to be successively engaged in the holes in the impression cylinder as, with the rotation of the plate cylinder, the printing plate impresses the image on the paper against the impression cylinder.

Although I have herein shown and described my invention in what I have conceived to be the most practical and preferred forms, I realize that certain additional modifications may well occur to one skilled in the art within the broad teaching hereof; Hence it is my intention that the invention be accorded the full scope of the claims so as to embrace any and all equivalent forms.

I claim:

1. A letterpress printing plate for use on a rotary press of the kind having a plate cylinder for printing on paper or the like against an impression cylinder, the plate cylinder having a series of sprockets formed on its surface along at least one edge thereof, and a guide cylinder disposed in parallel spaced relation to the plate cylinder; the letterpress printing plate being in the form of an elongate, looped band of flexible materials to be wrapped around the plate cylinder and the guide cylinder, and comprising:
   (a) a base layer;
   (b) a photoetched photosensitive layer attached to one face of the base layer and containing in relief both a printing image and a series of annular projections along at least one marginal side edge portion of the base layer; and
   (c) a series of sprocket holes, each formed through both the base layer and one of said annular projections, for engagement with the sprockets on the plate cylinder.

2. A letterpress printing plate as set forth in claim 1, wherein the annular projections have hollow interiors, and the sprocket holes in the base layer are respectively concentrically aligned with the hollow interiors of the annular projections.

3. A letterpress printing plate as set forth in claim 1, wherein the band of the superposed base layer and photosensitive layer has opposite ends and has a plurality of alternating tongues and recesses formed in staggered relation at the opposite ends thereof and interengaged to form the band into a loop.

4. A letterpress printing plate as set forth in claim 3, further comprising an adhesive tape attached to the looped band at the interengaged opposite ends thereof.

5. A letterpress printing plate as set forth in claim 1, wherein the base layer is comprised of polyester.

6. A letterpress printing plate as set forth in claim 1 or 5, wherein the base layer is less in thickness than the photosensitive layer.

7. A method of preparing a letterpress printing plate for use on a rotary press of the kind having a plate cylinder for printing on paper or the like against an impression cylinder, the plate cylinder having a series of sprockets formed on its surface along at least one edge thereof, and a guide cylinder disposed in parallel spaced relation to the plate cylinder, the method comprising the steps of:
   (a) providing an elongate flexible band comprising a base layer and a photosensitive layer attached to each other;
   (b) exposing the photosensitive layer to light through a negative to cause selective hardening at portions thereof defining a printing image and a series of positioning markings along at least one marginal side edge portion thereof while leaving unhardened the remaining portions of the photosensitive layer;
   (c) dissolving away the unhardened portions of the photosensitive layer in one and the same process to leave in relief the printing image and the series of positioning markings in the form of annular projections protruding from the base layer, the annular projections being disposed along at least one marginal side edge portion of the base layer;
   (d) forming a series of sprocket holes, each hole being formed through both the base layer and one of said annular projections; and (e) joining the ends of the band to form a loop which is to be wrapped around the plate cylinder and guide cylinder of the rotary press so that the sprockets on the plate cylinder can be engaged in the sprocket holes in the looped band.

8. A method of preparing a letterpress printing plate as set forth in claim 7, wherein the annular projections have hollow interiors, and the sprocket holes are formed by punching holes in the base layer through the hollow interiors of the annular projections.

9. A letterpress printing plate capable of being looped around both a plate cylinder and a guide cylinder spaced apart from the plate cylinder, the letterpress printing plate comprising: a flexible band comprised of a base layer and a photoetched photosensitive layer overlying and secured to the base layer, the photoetched photosensitive layer containing in relief both a printing image and a series of positioning markings in the form of annular projections along at least one marginal side edge portion of the base layer, and a plurality of perforations each extending through both the base layer and one of said annular projections.

10. A letterpress printing plate according to claim 9; wherein the annular projections have hollow interiors, and the perforations are in concentric alignment with the hollow interiors of respective ones of the annular projections.

11. A letterpress printing plate according to claim 10; wherein the positioning markings and the perforations extend lengthwise along both marginal side edge portions of the flexible band.

12. A letterpress printing plate according to claim 11; wherein the flexible band has a pair of band ends each having a plurality of widthwise extending alternating tongues and recesses which are staggered with respect to the alternating tongues and recesses at the other end so as to enable the band ends to be joined together to form the band into an endless loop by interengaging the tongues and recesses at the band ends.

13. A letterpress printing plate according to claim 10; wherein the flexible band has a pair of band ends each having a plurality of widthwise extending alternating tongues and recesses which are staggered with respect to the alternating tongues and recesses at the other end so as to enable the band ends to be joined together to form the band into an endless loop by interengaging the tongues and recesses at the band ends.

14. A method of preparing a letterpress printing plate capable of being joined together at its opposite ends to form an endless loop for looping around a plate cylinder and a guide cylinder of a rotary press, the method of comprising the steps of: providing an elongate flexible band comprised of a base layer and a photosensitive layer overlying and secured to the base layer; exposing the photosensitive layer to light through a patterned negative to create hardened portions of the photosensitive layer corresponding to a printing image and a series of annularly-shaped positioning markings extending lengthwise along at least one marginal side edge portion thereof while leaving unhardened the remaining portions of the photosensitive layer; dissolving away the unhardened portions of the photosensitive layer in one dissolving process to leave in relief on the base layer both the printing image and the series of positioning markings in the form of annular projections defined by the hardened portions of the photosensitive layer; and thereafter forming a series of perforations, each perforation being formed through both the base layer and one of said annular projections.

15. A method according to claim 14; wherein the annular projections have hollow interiors, and the forming step comprises forming the perforations concentric with the hollow interiors of respective ones of the annular projections.

16. A method according to claim 15; wherein the positioning markings in relief on the base layer and the perforations extend lengthwise along both marginal side edge portions of the base layer.

* * * * *